United States Patent [19]
Yamada et al.

[11] Patent Number: 4,742,329
[45] Date of Patent: May 3, 1988

[54] DIGITAL/ANALOG CONVERTER

[75] Inventors: Yasuhiro Yamada, Hashima; Masanori Kajitani, Gifu, both of Japan

[73] Assignee: Sanyo Electric Co., Ltd., Japan

[21] Appl. No.: 822,900

[22] Filed: Jan. 27, 1986

[30] Foreign Application Priority Data

Jan. 28, 1985 [JP] Japan .................................. 60-14032
Feb. 12, 1985 [JP] Japan .................................. 60-24785

[51] Int. Cl.$^4$ .......................................... H03M 1/82
[52] U.S. Cl. .......................................... 340/347 DA
[58] Field of Search .................................. 340/347 DA

[56] References Cited

U.S. PATENT DOCUMENTS

| | | | |
|---|---|---|---|
| 3,298,014 | 1/1967 | Stephenson | 340/347 DA |
| 3,577,084 | 5/1971 | Atcherson | 340/347 DA |
| 3,603,977 | 9/1971 | Szabo | 340/347 DA |
| 3,646,545 | 2/1972 | Naydan | 340/347 DA |
| 3,838,416 | 9/1974 | Brown | 340/347 DA |
| 3,887,911 | 6/1975 | Bell | 340/347 DA |
| 3,984,829 | 10/1976 | Zwack | 340/347 DA |

Primary Examiner—Charles D. Miller
Attorney, Agent, or Firm—Darby & Darby

[57] ABSTRACT

A digital/analog converter of the present invention is a pulse width modulation type, and is provided with a $2^N$ (N: the number of bits of digital data to be converted) notation counter circuit for counting clock pulses, pulse formation circuit which is given the counting output of the counter circuit and the digital data and outputs a pulse signal being varied its pulse width and pulse cycle period corresponding to the contents of the digital data and being decided the sum of the pulse widths of the pulse signal in the $2^N$ clocks period corresponding to the same, and means which selects corresponding to the pulse one of two potentials different in level and which composed the selected potential, so that the harmonic spectrum of an analog signal obtained as the output of the composite means is larger in the high band and smaller in the low band, resulting in that the digital/analog converter less in the harmonic distortion without using resistance of high accuracy is obtainable.

7 Claims, 10 Drawing Sheets

DIGITAL/ANALOG CONVERTER

BACKGROUND OF THE INVENTION

1. Field of the Invention

The present invention relates to a digital/analog (D/A) converter of high accuracy and high bit, which is used in, for example, a compact disc player, a sound synthesizer and the like.

2. Description of the Prior Art

The D/A converters of various systems have hitherto been put into practical use, which are roughly divided into an amplitude modulation (AM) type and a pulse width modulation (PWM) type.

The PWM type D/A converter is more advantageous than the AM type one in its simple construction of circuit and no need for an element of high accuracy (a resistance of high accuracy), while it is disadvantageous in slow conversion speed, or large harmonic distortion. Therefore, the inventors have proposed a D/A converter in which the PWM type and AM type D/A converter is combined (disclosed in the Japanese Patent Laid-Open No. 57-23321, 1982), which processes the digital data of the high order M bits among the input digital data of N bits by use of the AM type D/A converter which utilizes the resistance division, and the digital data of the low order (N−M) bits by use of the PWM type D/A converter which utilizes an output of a counter for counting clock pulses.

In such a hybrid type converter need not utilize resistance for the resistance division of high accuracy such as used in the AM type D/A converter which is given the entire N bits. In addition to the said advantage as in the PWM type A/D converter it also has another advantage that the conversion speed is fast as in the AM type one. However, the defect of large harmonic distortion has not been eliminated. For example, when the hydrid type D/A converter, which processes the high order 8 bits of the 16 bits digital data by an AM type D/A converter circuit and the low order 8 bits by a PWM type D/A converter circuit, is given the digital data of 16 bits corresponding to an analog value of 1 kHz and full-scale amplitude to thereby digital/analog-convert the data by a conversion frequency of 44.1 kHz, the harmonic distortion of the output analog signal at 20 kHz or less is about 0.05% in simulation by the fast Fourier transform (FFT). Such harmonic distortion can be said to be very large compared with the digital data of 16 bits which inherently has the resolution of 0.0015% ($=100 \div 2^{16}$).

Thus, the conventional D/A converter has the problem of the resistance of high accuracy being required, or the harmonic distortion being larger.

OBJECT OF THE INVENTION

A first object of the present invention is to provide a digital/analog (D/A) converter of a PWM type which is less in harmonic distortion.

A second object of the present invention is to provide a digital/analog (D/A) converter being hybrid of the AM and PWM types, which is less in harmonic distortion and high in the conversion speed, and requires no elements of high accuracy.

A third object of the present invention is to provide a digital/analog (D/A) converter of hybrid type of AM and PWM types, which is small in the chip size, less in power consumption, inexpensive to produce, and low in switching noise.

A fourth object of the present invention is to provide a digital/analog converter of a hybrid type of AM and PWM types, which is less in harmonic distortion depending on no conversion signal from the PWM type portion.

The above and further objects and features of the invention will more fully be apparent from the following detailed description with reference to accompanying drawings.

DETAILED DESCRIPTION OF THE PREFERRED EMBODIMENT

Figure 1:
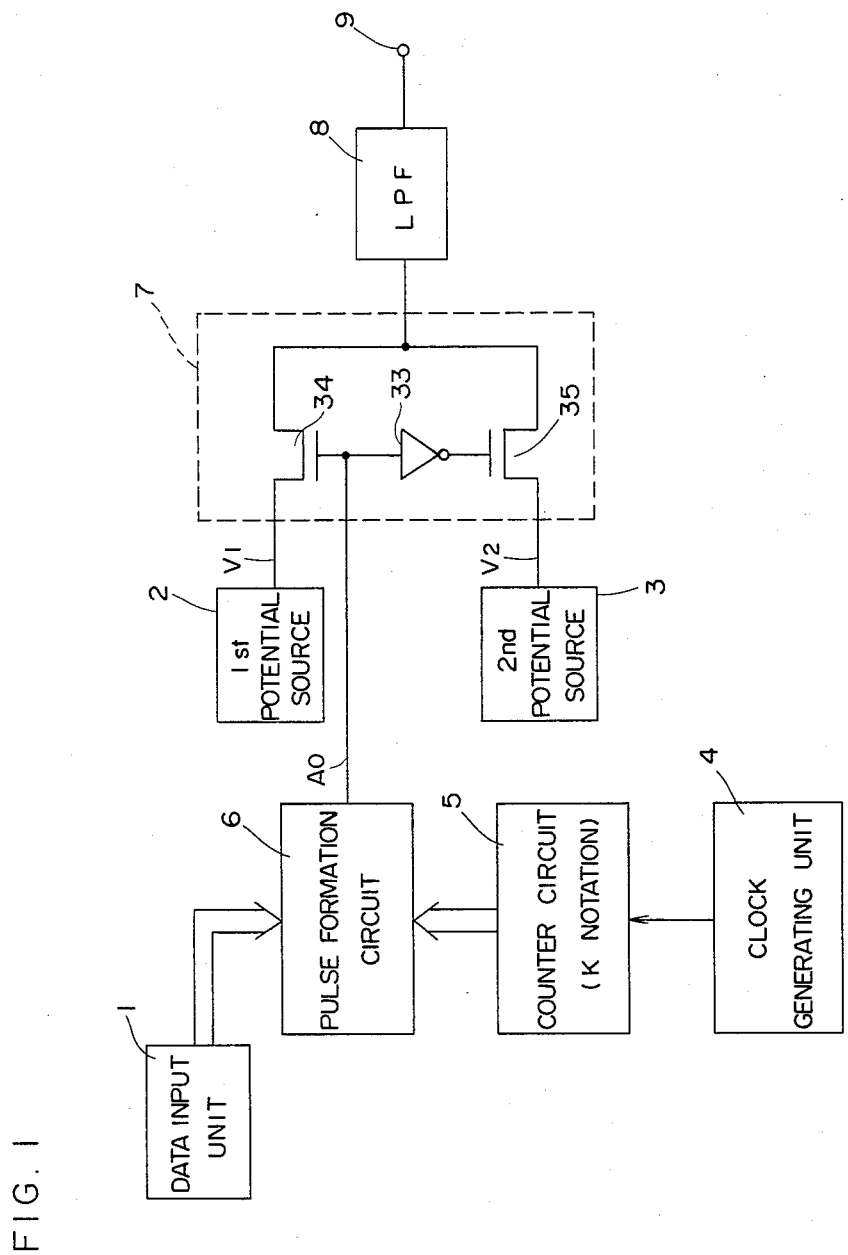
FIG. 1 is a block diagram of an embodiment of a PWM type D/A converter of the present invention.
Figure 2:
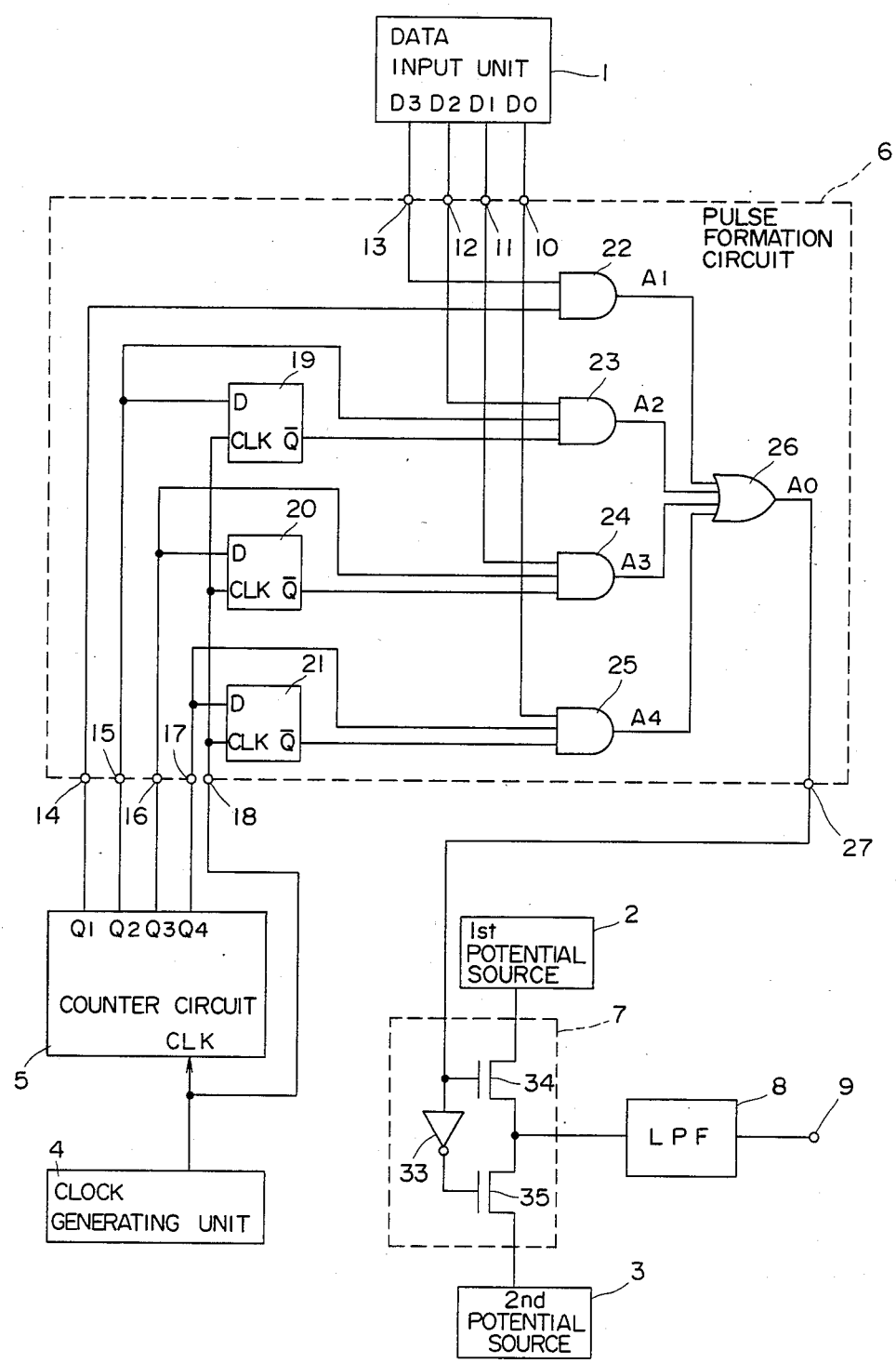
FIG. 2 is a block diagram, thereof, showing in detail a pulse formation circuit.
Figure 3:
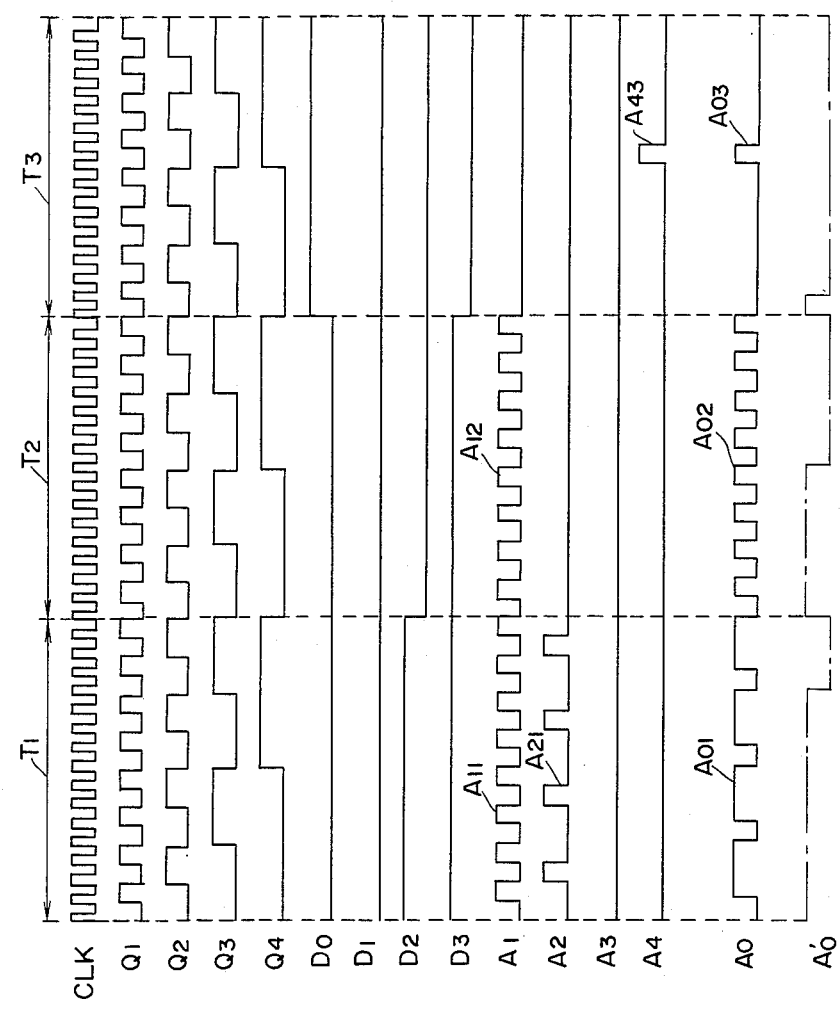
FIG. 3 is a time chart explanatory of the pulse formation circuit shown in FIG. 2.

FIG. 1 is a block diagram showing construction of the PWM type D/A converter of the present invention, in which reference numeral 1 designates a data input unit into which the digital data of K bits is introduced, 2 designates a first potential source for outputting a first potential $V_1$, 3 designates a second potential source for outputting a second potential $V_2$, 4 designates a clock pulse generating unit for generating clock pulses, 5 designates a counter circuit of K-notation ($n=2^k$) which receives the clock pulses from the clock pulse generating unit 4 and counts the clock pulses, 6 designates a pulse formation circuit which introduces therein the digital data of K-bits from the digital input unit 1 and the counting output from the counter circuit 5 to thereby form the output pulse which changes the sum of pulse width in a period of K clock pulses, and a pulse width and a pulse cycle period, corresponding to the contents of the input digital data (construction and operation of the pulse formation circuit is to be hereinafter described in accordance with FIGS. 2 and 3), 7 designates a circuit for selecting either of the first potential $V_1$ from the first potential source 2 or the second potential $V_2$ from the second potential source 3 corresponding to the output pulse from the pulse formation circuit and composing selected potential 6, 8 designates a low-pass filter, and 9 designates an output terminal.

The pulse formation circuit 6, in case K=4 is constructed as shown in, for example, FIG. 2. Namely, the pulse formation circuit 6 comprises: first, second, third and fourth data input terminals 10, 11, 12 and 13, into which the bit data $D_0$, $D_1$, $D_2$ and $D_3$ from the data input unit are introduced; first, second, third and fourth input terminals 14, 15, 16 and 17, into which the counting outputs $Q_1$, $Q_2$, $Q_3$ and $Q_4$ from the counter circuit 5 are introduced; a fifth input terminal 18 into which the clock pulse CLK from the clock pulse generating unit 4 is introduced; first, second and third delayed flip-flops 19, 20 and 21 which receive at the D-input-terminals thereof the counting outputs $Q_2$, $Q_3$ and $Q_4$ from the second, third and fourth input terminals 15, 16 and 17 and at clock input terminals and clock pulse CLK from the fifth input terminal 18 respectively; a first AND gate 22 for introducing therein the bit data $D_3$ from the fourth data input terminal 13 and the counting output $Q_1$ from the first input terminal; a second AND gate 23 for introducing therein the bit data $D_2$ from the third data input terminal 12, the counting output $Q_2$ from the second input terminal 15, and a $\bar{Q}$ output of the first delayed flip-flop 19; a third AND gate 24 for introducing therein the bit data $D_1$ from the second data input terminal 11, the counting output $Q_3$ from the third input terminal 16, and a $\bar{Q}$ output of the second delayed flip-flop 20; a fourth AND gate 25 for introducing therein the bit data $D_0$ from the first data input terminal 10, the counting output $Q_4$ from the fourth input terminal 17, and a $\bar{Q}$ output of the third delayed flip-flop 21; an OR gate 26 introducing therein outputs $A_1$, $A_2$, $A_3$ and $A_4$ of the first, second, third and fourth AND gates 22, 23, 24 and 25, and an output terminal 27 for applying an output $A_0$ of the OR gate 26 to a selectively composite circuit 7.

In other words, the order of digits of the input digital data and that of the outputs of counter circuit 5 are combined reversely with each other and then introduced into the AND gates 22, 23, 24 and 25, and the outputs $Q_2$, $Q_3$ and $Q_4$ other than the lowermost digit at the counting circuit 5 are also given to the delayed flip-flops 19, 20 and 21, the outputs thereof also being given to the AND gates 23, 24 and 25 in the same manner as the outputs $Q_2$, $Q_3$ and $Q_4$.

Referring to FIG. 3, a typical operation of the pulse formation circuit 6 is described, which shows a case that data "12" ($D_0=0$, $D_1=0$, $D_2=1$ and $D_3=1$), data "8" ($D_0=0$, $D_1=0$, $D_2=0$ and $D_3=1$) and data "1" ($D_0=1$, $D_1=0$, $D_2=0$ and $D_3=0$), are introduced into the first, second, third and fourth data input terminals 10, 11, 12 and 13 respectively from data input unit in the first, second and third periods $T_1$, $T_2$ and $T_3$ each corresponding to a conversion period (the clock period of $K=2^k$). Since the significant information "1" is applied to the third and fourth data input terminals 12 and 13 in the first period $T_1$, the AND gate outputs $A_{11}$ and $A_{21}$ appear at the first and second AND gates 22 and 23 respectively. While, the logical sum $A_{01}$ appears in the output $A_0$ of the OR gate 26, as the third and fourth AND gates 24 and 25 have no significant information. The logical sum $A_{01}$ is a pulse signal, which is 12, representing the sum of pulse widths in the period of a logical "1", where the pulse width and pulse cycle are so formed as the logical "1" and "0" being distributed rather uniformly through the entire first period $T_1$. Since the significant information of logical "1" is introduced only into the fourth data input terminal 13 which is given the bit data $D_3$ in the second period $T_2$, the OR gate 26 outputs a pulse signal $A_{02}$ which is coincident with the output $A_{12}$ of the first AND gate 22. The pulse signal $A_{02}$ is the one which is composed of the sum of pulse widths and represents numeral 8, which has the pulse width and pulse cycle period wherein the logical "1" and "0" are distributed respectively rather uniformly throughout the entire second time period $T_2$.

Furthermore, as the significant information is introduced only into the first data input terminal 10 which is given the bit data $D_0$ in the third period $T_3$ wherein the digital data "1" is introduced, the OR gate 26 outputs a pulse signal $A_{03}$ which is coincident with the output $A_{43}$ of the fourth AND gate 25.

Thus, without regard to whether digital data is introduced, the pulse width and pulse cycle period are varied corresponding to the input data in a manner that the pulses are distributed rather uniformly within one conversion period and also the sum of pulse widths is determined, which can also be same when the bit number K being larger than numeral 4 of the input digital data.

The pulse signals $A_{01}$, $A_{02}$ and $A_{03}$ thus output are introduced into the selective composite circuit 7, which comprises a transistor 34 through which the pulse signal is given directly to the gate, an inverter 33 which is given the pulse signal, and a transistor 35 given the pulse signal through the inverter 33, so that a desired analog signal from the output terminal 9 is obtained by connecting the node of both the transistors 34 and 35 to the low-pass filter 8. The transistor 34 is on while the output pulse signal from the pulse formation circuit 6 is logical "1", thereby selecting the first potential $V_1$, and the transistor 35 is on while the same is logical "0", thereby selecting the second potential $V_2$, the potentials $V_1$ and $V_2$ being composed in a time series manner with each other and being eliminated harmonic component by the low-pass filter so as to be output.

The D/A converter, such as disclosed in the Japanese Patent Laid-Open No. 57-23321 (1982), varying its duty corresponding to the contents of input digital data, selects either of the first or second potential due to the pulse signal $A_0'$ as shown in FIG. 3 and composes selected potential. When compared with the aforesaid pulse signal $A_0'$, the signal $A_0$ of the present invention includes the high frequency component more than the signal $A_0'$. Hence, even when the harmonic component of the pulse signal $A_0'$ is not eliminated by the low-pass filter, the harmonic component $A_0$ is eliminated.

Figure 4:
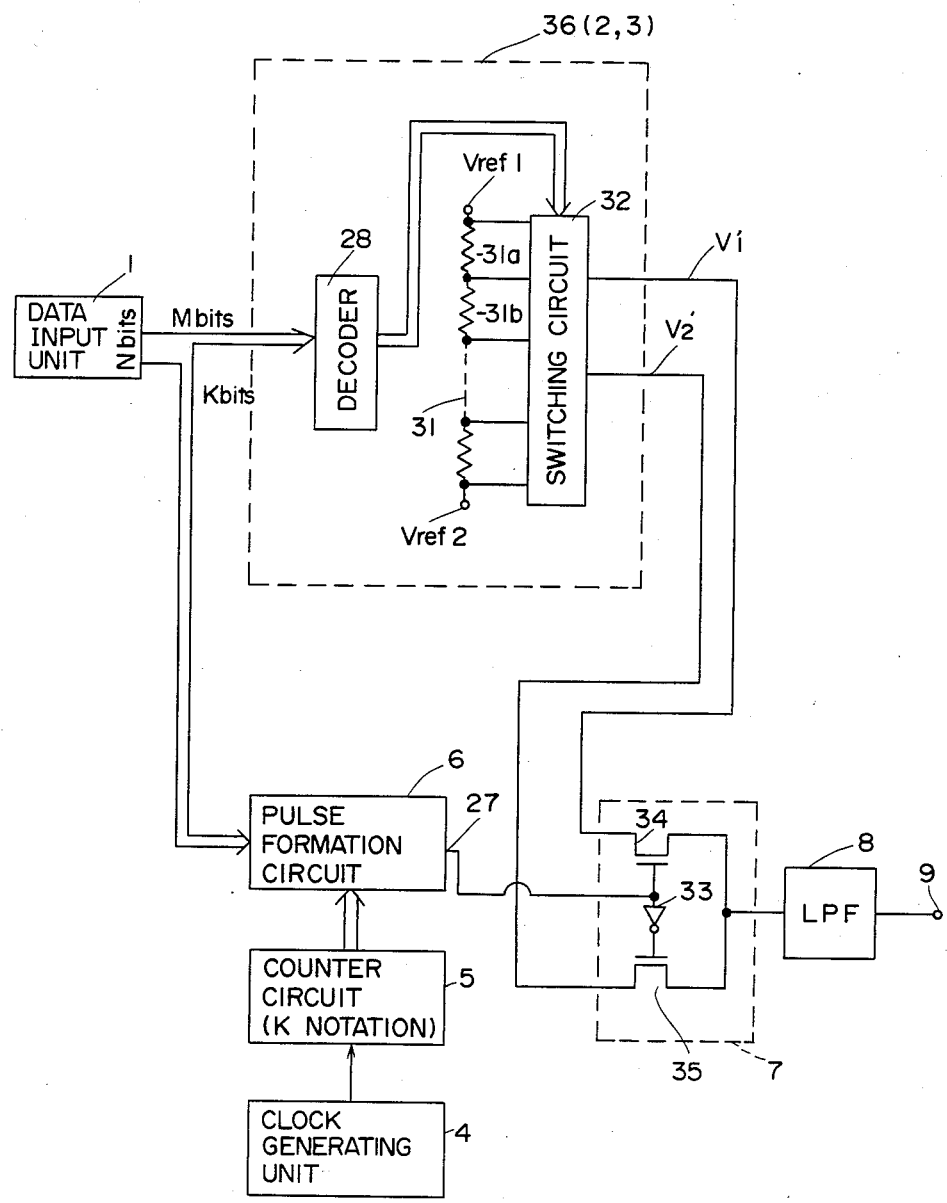
FIG. 4 is a block diagram of an embodiment of a D/A converter of the present invention which is hybrid type of AM and PWM types.

Referring to FIG. 4, a hybrid type D/A converter is shown which is adapted to digital/analog-convert both the high order bits through an AM type D/A converter circuit and the low order bits through the aforesaid PWM type D/A converter circuit as the same as the D/A converter disclosed in the Japanese Patent Laid-Open No. 57-23321 (1982), and in which a data input unit 1 is given the data of N ($=M+K$) bits, the high order M bits data being applied to an AM type D/A converter circuit 36 and the low order K bits data to the aforesaid pulse formation circuit 6. The D/A converter circuit 36 is provided with a potential divider circuit 31 which divides the potential between the first reference potential Vref1 and the second reference potential Vref2 by $2^M$ uniform resistances 31a, 31b..., the output terminals led out from the resistances 31a, 31b... are connected to a switching circuit 32. A decoder 28, into which the M bits data are introduced, delivers to the switching circuit 32 a signal corresponding to the input contents, so that two potentials $V_1'$ and $V_2'$, corresponding to the M bits data introduced into the decoder 28, are adapted to be fetched from the switching circuit 32, the two potentials $V_1'$ and $V_2'$ being adjacent to each other, in other words, two potentials across both ends of any resistance constituting the potential divider circuit 31.

Also, the potentials $V_1'$ and $V_2'$ are given as the aforesaid first and second potentials $V_1$ and $V_2$ to the transistors 34 and 35 respectively. In other words, the AM type D/A converter circuit 36 functions as the first and second potential sources 2 and 3.

Such hybrid type D/A converter, which generates by the high order M bits the first and second potentials $V_1$ and $V_2$ for digital/analog-converting the low order K bits, has the following advantages: Since the AM type converter circuit is partially used, the conversion speed is fast, and since the AM type converter circuit is used at the most significant bit side and the PWM type one at the least significant bit side whereby there is no need of using a resistance of high accuracy in the AM type D/A converter circuit, and the existance of the aforesaid pulse formation circuit 6 helps reduce the harmonic distortion.

When the D/A converter, bit number N being 16 (M=K=8) as shown in FIG. 4, is given the 16 bits data corresponding to an analog value of 1 kHz and full-scale amplitude to digital/analog-convert the data by sampling frequency of 44.1 kHz of compact disc player, a harmonic distortion factor at 20 kHz or less of the audio frequency is about 0.001 to 0.02%, which shows remarkable improvement compared with the conventional factor of 0.05%.

Figure 5:
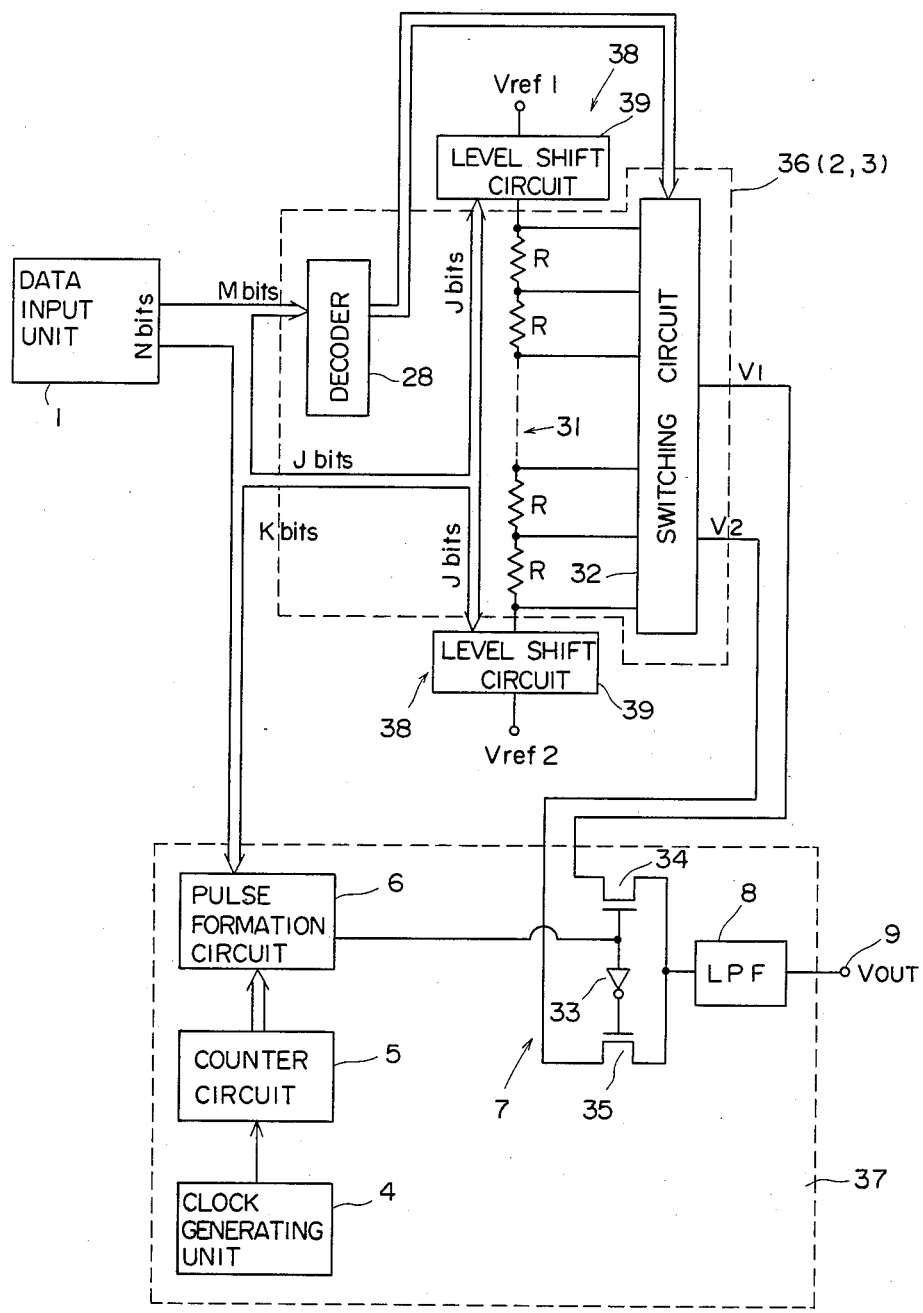
FIG. 5 is a modified embodiment of a D/A converter of the present invention which is hybrid type of the AM and PWM types.

FIG. 5 is a block diagram of an embodiment of an AM/PWM hybrid type D/A converter of the present invention, which enables to miniaturize the chip size and save power consumption. In order to make the D/A converter of the aforesaid present invention inexpensive and miniaturize the components incorporated therein, the chip size in the converter must be minimized. For this purpose, it is effective to minimize the potential divider circuit occupying a large space. Therefore, the bit number M and the number of resistances need to be reduced, then the number N−M of bits for D/A conversion in the PWM type increases to enlarge the notation in the counter circuit 5, while decreases the conversion speed to that extent. In order to avoid that situation, the frequency of clock pulse need only be raised, but consequently leads to the power consumption increase, being undesirable for the battery drive. Also, when the clock pulse frequency is high, switching noises increase and the unwanted radiation is created during the adjustment, thereby deteriorating the performance as the D/A converter.

Referring to FIG. 5, a D/A converter is shown which enables to miniaturize the chip size thereof, save the power consumption, and reduce the switching noises. The D/A converter as shown in FIG. 5 is so constructed that the high order M bits among the N (=M+K+J) bit data are converted by a first AM type D/A converter circuit, the middle order K bits are converted by a second PWM type D/A converter circuit which uses the first and second potentials $V_1$ and $V_2$ being produced by conversion of the M bits, and the low order bits are converted by a third D/A converter circuit which shifts the potential to be given to the potential divider circuit at the first D/A converter circuit.

Next, explanation will be given on an embodiment of the D/A converter of the present invention, bit number N being 16 (input data $a_{16}, a_{15}, \ldots a_1$), the high order 8 bits $a_{16}, a_{15}, \ldots a_9$ (M=8) being given to the first D/A converter circuit 36, the middle order 4 bits $a_8, a_7, a_6$ and $a_5$ (K=4) being given to the second D/A converter 37, and the low order 4 bits $a_4, a_3, a_2$ and $a_1$ (J=4) being given to the third D/A converter circuit 38.

Figure 6:
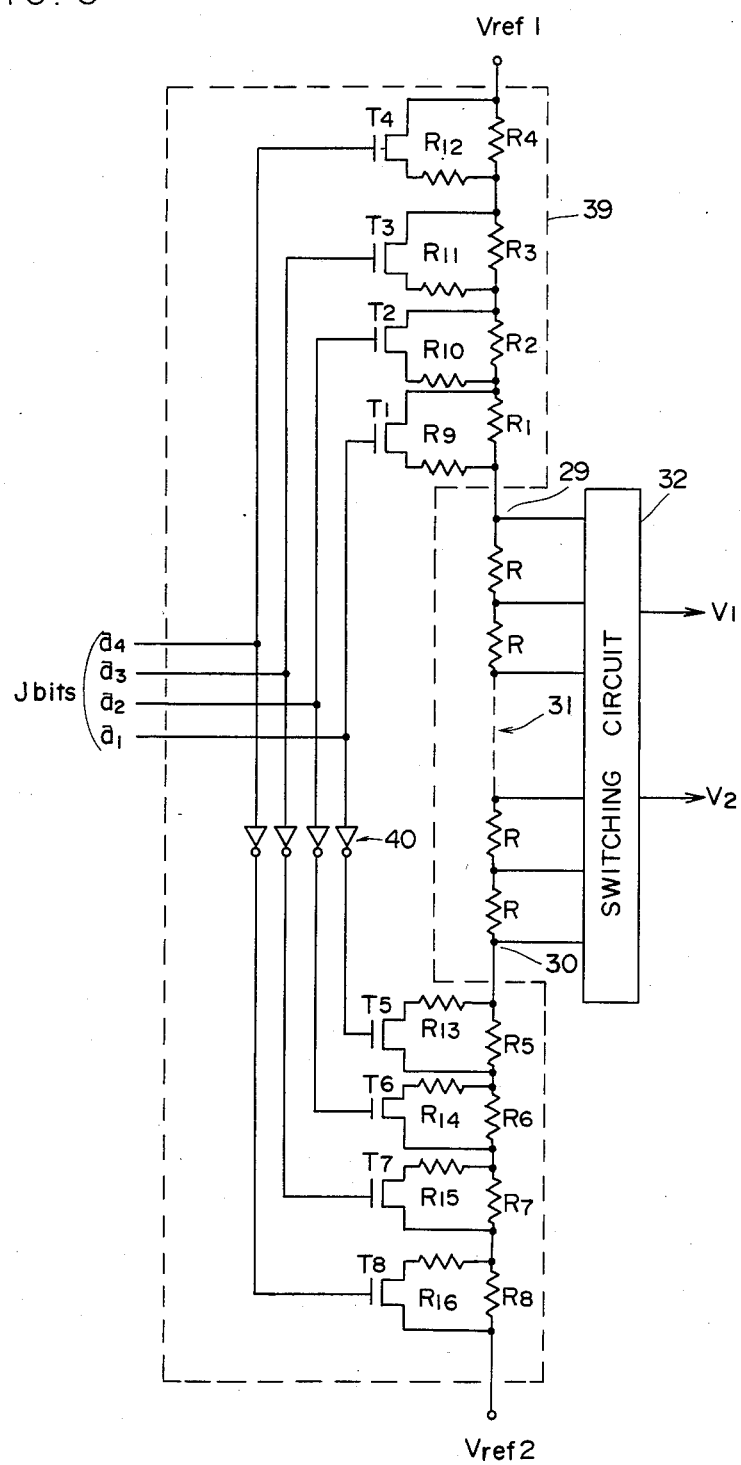
FIG. 6 is a circuit diagram of an embodiment of a level shift circuit of the present invention.

Now, level shift circuits 39 are interposed between the potential divider circuit 31 at the first D/A converter 36 and the potential sources which generate the first and second reference potentials Vref1 and Vref2 respectively, and serve as the third D/A converter circuit into which are given the data of the low order bits. The level shift circuit is constructed as shown in FIG. 6. Between one end of the potential divider circuit 31 and the Vref1 source are connected in series resistances $R_1, R_2, R_3$ and $R_4$ in this order, and between the other end of the potential divider circuit 32 and the Vref2 source are connected resistances $R_5, R_6, R_7$ and $R_8$ in series with each other and in this order. Between both ends of the resistance $R_1$, a series circuit of the resistance $R_9$ and a switching transistor $T_1$ is so connected that the resistance $R_9$ is positioned at the potential divider circuit 31 side. In the same manner, series circuits of resistances $R_2, R_3, R^4, R_5, R_6, R_7$ and $R_8$ and those $R_{10}, R_{11}, R_{12}, R_{13}, R_{14}, R_{15}$ and $R_{16}$ and switching transistors $T_2, T_3, T_4, T_5, T_6, T_7$ and $T_8$, are connected so that the respective resistances are disposed at the potential divider circuit 31 side. The J (=4) bit data $a_1, a_2, a_3$ and $a_4$ are given directly to the gates of switching transistors $T_1, T_2, T_3$ and $T_4$, or given to the gates of switching transistors $T_5, T_6, T_7$ and $T_8$ through inverters 40 respectively.

When a resistance value of the resistance which constitutes the potential divider circuit 31 is represented by R and resistance values of resistances $R_1$ to $R_{16}$ are represented by the same references, each resistance value has been so decided that the following relational equations should hold:

$$\left. \begin{array}{l} R_1 \text{ to } R_8 = R \\ R_9 = R_{13} = 255 \times R \\ R_{10} = R_{14} = 127 \times R \\ R_{11} = R_{15} = 63 \times R \\ R_{12} = R_{16} = 31 \times R \end{array} \right\} \quad (1)$$

When a resistance value between one end 29 of the potential divider circuit 31 and the Vref1 source is represented by $R_{29}$ and that between the other end 30 and the Vref2 source is represented by $R_{30}$, $R_{29}$ or $R_{30}$ is reduced by $$R - \frac{255R \times R}{255R + R} = \frac{R}{256}$$

when the switching transistor $T_1$ or $T_5$ is on. In the same manner, $R_{29}$ or $R_{30}$ is reduced by R/128 when the switching transistor $T_2$ or $T_6$ is on, the same is reduced by R/64 when that $T_3$ or $T_7$ is on, and the same is reduced by R/32 when that $T_4$ or $T_8$ is on.

The existence of inverter 40 allows the switching transistors $T_1$ to $T_4$ and $T_5$ to $T_8$ to be on or off complementally with each other, whereby a resistance value Rj between the Vref1 source and the Vref2 source is kept in the following equation regardless of values of data $a_1$ to $a_4$:

$$Rj = (256 + 8 - 15/256)R \quad (2)$$
$$= Ja \times R$$

where $Ja = 264 - 15/256$. Moreover, since the resistance values $R_{29}$ and $R_{30}$ are changed to 0, R/256, 2R/256 . . . 15R/256 corresponding to the values of data $a_1$ to $a_4$, the level at the potential division output terminal at the potential divider circuit 31, in turn potentials $V_1$ and $V_2$, can be shifted in sixteen grades (an extent of 4 bits).

Next, explanation will be given on operation of the third D/A converter circuit with one bit in LSB (least significant bit) of the N (=16) bit data varying.

(1) When the J=4 bit data $a_1$, $a_2$, $a_3$ and $a_4$ are $a_1 = a_2 = a_3 = a_4 = 0$, the following equations are given:

$$R_{29} = 4R,$$

$$R_{30} = 4R - 15R/256,$$

then, the potential $V_{30}(0)$ at the terminal 30 is given in the following equation:

$$V_{30}(0) = (Vref1 - Vref2) \times (4R - 15R/256)/Rj \quad (3)$$

(2) When $a_1 = 1$ and $a_2 = a_3 = a_4 = 0$, the following equation is obtained:

$$R_{29} = 4R - R/256, \quad R_{30} = 4R - 14R/256.$$

Then, the potential $V_{30}(1)$ at the terminal 30 is given in the following equation:

$$V_{30}(1) = (Vref1 - Vref2) \times (4R - 14R/256)/Rj \quad (4).$$

Hence, a potential difference $E_{LSB}$ between $V_{30}(0)$ and $V_{30}(1)$ is given in the following equation:

$$E_{LSB}\{Vref1 - Vref2) \times R/Rj\}/256 \quad (5).$$

The voltage step $e_M$ between the potential division terminals at the potentialdivider circuit 31 is given in the following equation:

$$e_M = (Vref1 - Vref2) \times R/Rj \quad (6).$$

Therefore, it shows that $E_{LSB}$ divides further to 1/256 the potential after being divided by the potential divider circuit 31.

The first D/A converter circuit 36 selects through switching circuit 32 two adjacent potentials among the potential division outputs from the potential divider circuit 31 corresponding to values $a_{16}$ to $a_9$ of the M (=8) bit digital signal and outputs potentials $V_1$ and $V_2$ ($V_1 > V_2$), thereby enabling the $V_1$ and $V_2$ to be given in the following equations:

$$V_2 = \{(Vref1 - Vref2/Rj) \times \{4R - 15R/256 + (a_{16} \times 2^7 + \quad (7)$$
$$a_{15} \times 2^6 + \ldots a_9 \times 2^0)R + (a_4 \times 2^3 + a_3 \times 2^2 +$$
$$a_2 \times 2^1 + a_1 \times 2^0) \times R/256\}$$
$$= Vconst. + (a_{16} \times 2^7 + a_{15} \times 2^6 + \ldots + a_9 \times 2^0) \times$$
$$e_M + (a_4 \times 2^3 + a_3 \times 2^2 + a_2 \times 2^1 + a_1 \times 2^0) \times e_M/256$$

and $$V_1 = V_2 + e_M \quad (8)$$

where $$Vconst = (Vref1 - Vref2) \times (4R - 15R/256)Rj.$$

The middle order K (=4) bits are divided by the second D/A converter circuit 37 into sixteen grades. Thus, as output Vout from the above D/A converter is given in the following equation:

$$Vout = V_2 + \{(a_8 \times 2^3 + a_7 \times 2^2 + a_6 \times 2^1 + a_5 \times 2^0) \times e_M\}/16 \quad (9)$$

Then, Vout is given from the equation (7) and (9) as follows:

$$Vout = Vconst. + (a_{16} \times 2^7 + a_{15} \times 2^6 + \ldots + a_9 \times 2^0)$$
$$\times e_M + (a_8 \times 2^3 + a_7 \times 2^2 + a_6 \times 2^1 + a_5 \times 2^0$$
$$) \times e_M/16$$
$$+ (a_4 \times 2^3 + a_3 \times 2^2 + a_2 \times 2^1 + a_1 \times 2^0) \times e_M/256$$
$$= (a_{16} \times 2^{15} + a_{15} \times 2^{14} + \ldots + a_8 \times 2^7 + \ldots$$
$$+ a_1 \times 2^0)$$
$$\times e_M/256 + Vconst. \quad (10)$$

Hence, in the FIG. 5 embodiment, the D/A converter of 16 bits with $e_M/256$ as LSB is realized.

The D/A converters shown in FIGS. 5 and 6 save the power consumption more than that shown in FIG. 4. In detail, when the circuit shown in FIG. 4 holes M=8 and K=8 with the conversion frequency of 44.1 kHz, $2^8$ times the frequency of 44.1 kHz, that is, 11.29 MHz or more, is required as the clock frequency for the counter circuit 5. While, for the D/A converters shown in FIGS. 5 and 6 need only be of $2^4$ times the frequency: 705.6 kHz or more because of K=4, thereby enabling to realize the D/A converter which saves more power consumption, causes less switching noises from high frequency clock pulses and less unwanted radiation.

On the other hand, in a case where the value K is decided in the same manner as in FIG. 4, the value M can be reduced to that extent, thereby enabling the chip size to be miniaturized.

Also, the third D/A converter circuit 38 or the level shift circuit 39 employs the resistances $R_1$ to $R_8$ of low resistance values which is connected in parallel to those $R_9$ to $R_{16}$ of high resistance values, thereby utilizing the entire resistance values to be digitally varied, thereby not requiring high accuracy on the resistances $R_9$ to $R_{16}$ of high resistance values respectively. For example, though the resistances $R_1$, $R_5$, $R_9$ and $R_{13}$ each represent the minimum resolution (LBS) of 16 bits, a resistance ratio (in a range of $\pm\frac{1}{2}$ LSB) required to the resistances $R_1$, $R_5$ and $R_9$, $R_{13}$ being 1:170 to 511, whereby the resistances $R_9$, $R_{13}$ require not so accuracy as in that of the first D/A converter circuit 36. Accordingly, the third D/A converter circuit increases in number so as only to slightly increase the chip size.

Figure 7:
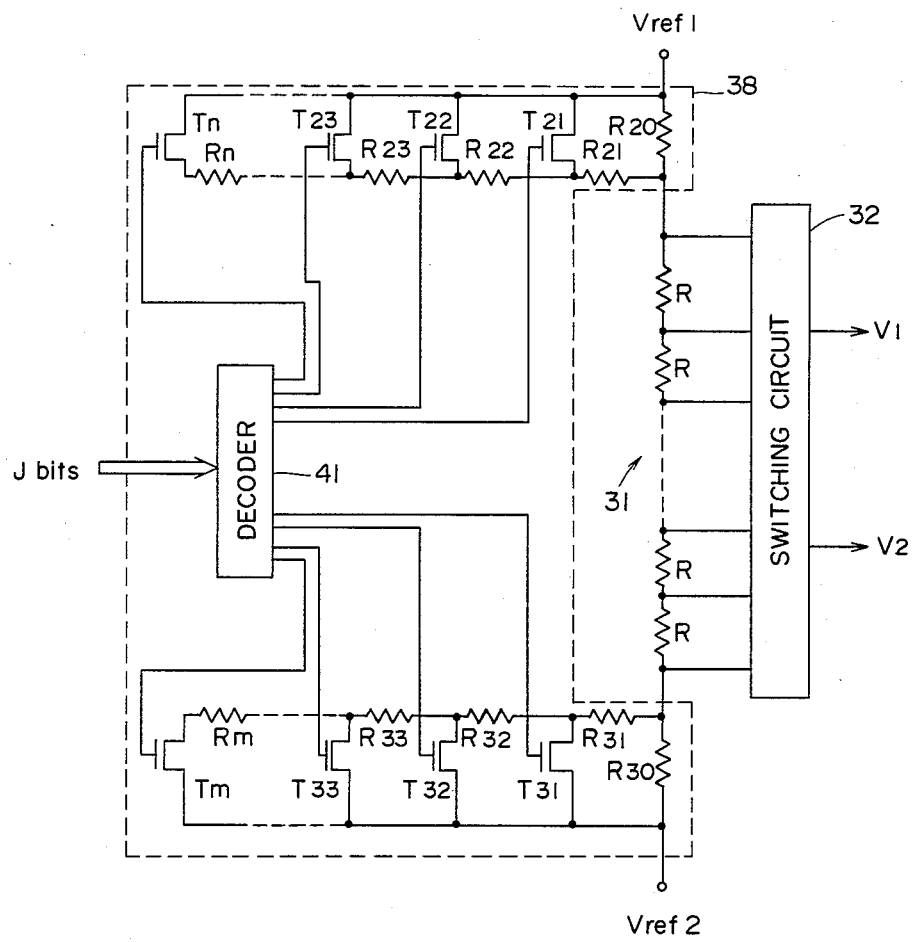
FIG. 7 is a circuit diagram of a modified embodiment of the level shift circuit shown in FIG. 6.

Referring to FIG. 7, a modified embodiment of the third D/A converter circuit 38 of the present invention is shown, which is different from the one shown in the FIG. 6 embodiment in that a decoder 41 is provieed and each one resistance $R_{20}$ or $R_{30}$ is connected in series with each one side of the potential divider circuit 31, the resistances $R_{20}$ and $R_{30}$ being adapted to be connected in parallel to one or a plurality of high resistance corresponding to the input digital data.

In other words, the resistance $R_{20}$ is connected in a parallel manner to series circuits of resistances $R_{21}$, $R_{22}$, $R_{23}$... $R_n$ and switching transistors $T_{21}$, $T_{22}$, $T_{23}$... $T_n$ respectively, that is the switching transistors $T_{21}$, $T_{22}$, $T_{23}$... are connected between the line connecting the transistor $T_n$ and resistance $R_{20}$ and the respective connection nodes for the resistances $R_{21}$, $r_{22}$, $R_{23}$... $R_n$. At the resistance $R_{30}$ side, resistances $R_{31}$, $R_{32}$, $R_{33}$... $R_m$ and switching transistors $T_{31}$, $T_{32}$, $T_{33}$... $T_m$ are connected in the same manner as above.

The data of J bits is introduced in the decoder 41, which generates a signal corresponding to the input data to have one of the switching transistors $T_{21}$, $T_{22}$, $T_{23}$... $T_n$ and one of those $T_{31}$, $T_{32}$, $T_{33}$... $T_m$ turned on, so that one or a plurality of high resistances $R_{21}$, $R_{22}$... $R_n$ and $R_{31}$, $R_{32}$... $R_m$ which are decided by the turned-on transistor are to be connected in parallel to the resistances $R_{20}$ and $R_{30}$ respectively.

Now, in the D/A converter or the second D/A converter circuit 37 of the present invention having the pulse formation circuit 6 as shown in FIG. 2, when the input data $D_0$, $D_1$, $D_2$ and $D_3$ are all a logical "0" or a logical "1", the output $A_0$ of the OR gate 26 is kept unchanged keeping the logical "0" or "1", and the potential $V_2$ or $V_1$ is kept selected in one conversion period. In order words, two potentials cannot be widely distributed within one conversion period, thereby causing the problem of the harmonic spectrum becoming larger in the low band when such condition continues.

Figure 8:
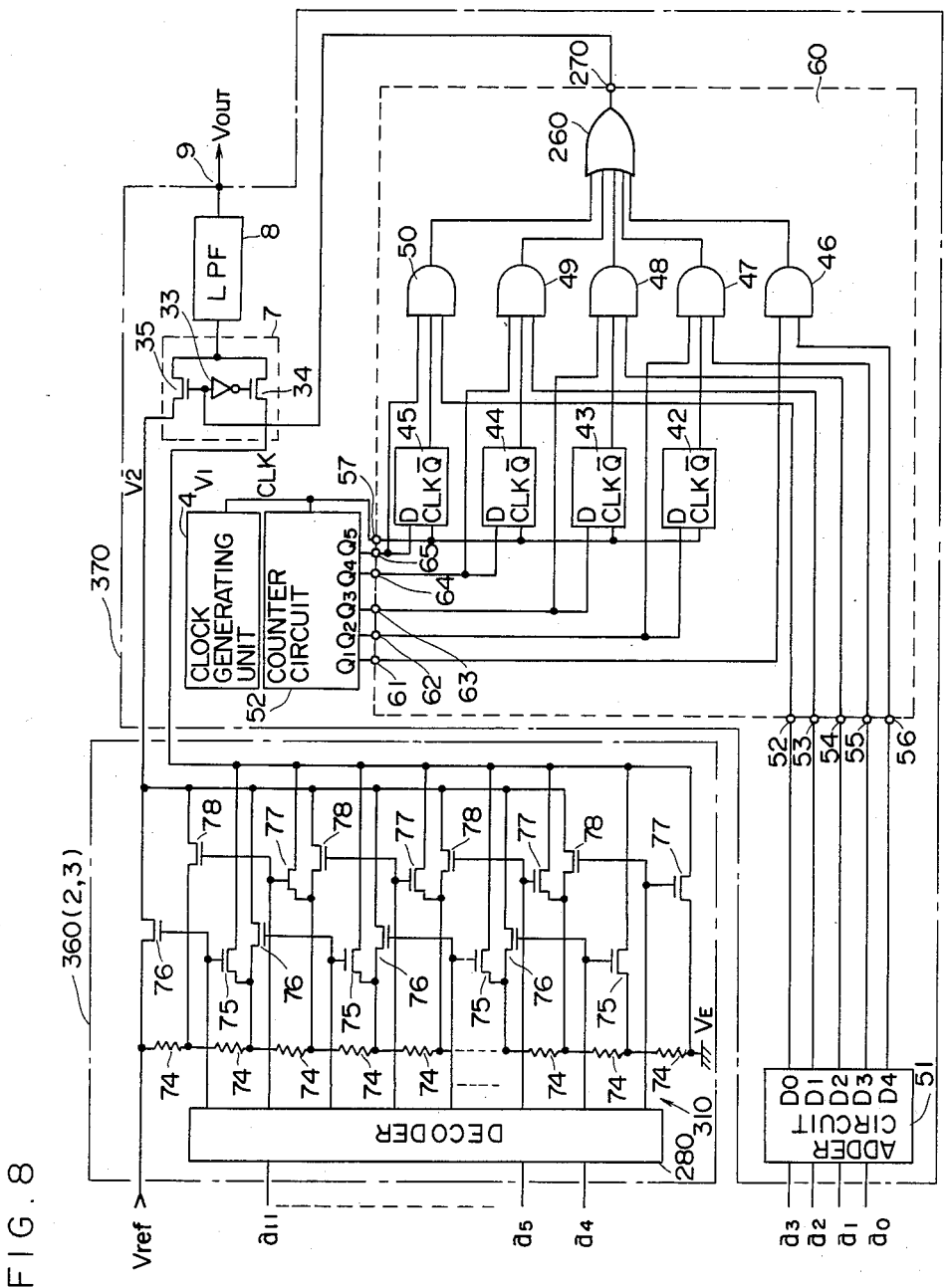
FIG. 8 is a circuit diagram of another modified embodiment of the D/A converter of the present invention which is a hybrid type of AM and PWM types.

FIG. 8 shows an AM/PWM hybrid type D/A converter solvable of such problem.

This converter circuit is characterized in that the data of the low order K bits which conduct the PWM type D/A conversion among the input digital data of N ($=M+K$) bits are added with the data of $(K+1)$ bits, in which the $(K-1)$th bit in the low order is a logical "1" and other bits are "0", thereby forming the data of $(K+1)$ bits and giving the data of $(K+1)$ bits to the aforesaid pulse formation circuit 6.

Next, for the convenience of explanation, assumptions are used that $N=12$, $M=8$ and $K=4$, and the data $a_4$, $a_5$, $a_6$... $a_{11}$ of the high order 8 bits are applied to the first D/A converter circuit 360 and those $a_0$, $a_1$, $a_2$ and $a_3$ of the low order 4 bits are applied to the second D/A converter circuit 370. Hence, when the data $a_0$, $a_1$, $a_2$ and $a_3$, in case all logical being "0", are added with logical "0100", logical "00100" is produced, and when the same data in case all logical being "1", are added with logical "0100", logical "10011" is produced, resulting in that the two potentials $V_1$ and $V_2$ alternate with each other.

next, the above operation will be concretely described.

A potential divider circuit 310 at a first D/A converter circuit 360 comprises $2^8+2$ resistances 74 which have equal values being connected in series with each other so as to divide the potential between two reference potentials Vref and $V_E$ into $2^8+2$. Hence, the voltage step $e_M$ between the potential division output terminals is given in the following equation:

$$e_M = (V_{ref} - V_E)/(2^8+2).$$

Among the potential division output terminals at the respective resistances 74 at the potential divider circuit 310, a $(2L-1)$th terminal (L: a natural number and $L \leq 2^7$) in the potential increasing order is connected to the drain of a switching transistor 34 through an insulated gate type field-effect transistor (IGFET) 75, a $(2L+1)$th terminal and a terminal for Vref are connected to the drain at a switching transistor 35 through IGFET 76 respectively, a $(2L-2)$th terminal and a terminal for $V_E$ are connected to the drain at the switching transistor 34 through IGFET 77, and a 2Lth terminal is connected to the drain at the switching transistor 35 through an IGFET 78. The IGFETs 75 and 76 are connected at the gate terminals thereof in such a manner that the 2Lth output from the lowest one among the $2^8$ outputs of a decoder 280 which decodes the data of the high order 8 bits simultaneously conducts the IGFET 76 which is connected to a $(2L+1)$th terminal (including the Vref terminal) in the potential increasing order among the potential division output terminals at the potential divider circuit 310 with the IGFET 75 connected to the $(2L-1)$th terminal among the same. The IGFETs 77 and 78 are connected at the gate terminals thereof in such a manner that the $(2L-1)$th output from the lowest one among the $2^8$ outputs of the decoder 280 simultaneously conducts the IGFET 78 which is connected to the 2Lth terminal in the potential increasing order among the potential divison output terminals at the aforesaid potential divider circuit 310 with the IGFET 77 which is connected to the $(2L-2)$th terminal (including the $V_E$ terminal) among the same. Either the conduction of the IGFETs 76 and 75, or those of 78 and 77 allows to obtain the outputs $V_2$ and $V_1$ corresponding to the input data of the high order 8 bits, the outputs $V_2$ and $V_1$ being given to the switching transistors 35 and 34 respectively. In other words, in this embodiment also, the first D/A converter circuit 360 serves as the first and second potential sources for the second D/A converter circuit 370.

The second D/A converter circuit 370 comprises: and adder circuit 51 which adds the data of 5 bits, a third bit from the L S B being a logical "1" and other bits being all logical "0" to the data $a_0$, $a_1$, $a_2$ and $a_3$ of the low order 4 bits; a clock pulse generating unit 4 for generating clock pulses; a $2^5$ notation counter circuit 52 for counting clock pulses output from the clock pulse generating unit 4; a pulse formation circuit 60 (construction and operation of which are to be described later) which is given the processing data comprising the data of the low order 4 bits output from the aforesaid adder circuit 51, to which the data of 5 bits, a third bit from the least significant one being a logical "1" and other bits being all logical "0" are added, the clock pulses output from the aforesaid clock pulse generating unit 4, and the counting output from the counter circuit 52, thereby forming the output pulse which varies in the sum of pulse width in the $2^5$ clock pulse period corresponding to the contents of the input processing data and also in the pulse width and pulse cycle period; a selectively composite circuit 7 comprising of switching transistors 33 and 34 which select either of the two potentials $V_1$ and $V_2$ corresponding to the output pulse from the pulse formation circuit 60 and then compose the selected potential, and an inverter 33; and a low pass filter 8 in which the output of the selectively composite circuit 7 is introduced, the output analog signal Vout being obtained from the terminal 9. In addition, the data input unit for introducing therein the digital data of 12 bits $a_0$, $a_1$ ... $a_{11}$ is omitted from the drawings.

The pulse formation circuit 60 is provided with: first, second, third, fourth and fifth data input terminals 52, 53, 54, 55 and 56 into which the bit data $D_0$, $D_1$, $D_2$, $D_3$ and $D_4$ from the adder circuit 51 are introduced respectively; first, second, third, fourth and fifth input terminals 61, 62, 63, 64 and 65 into which the count outputs $Q_1$, $Q_2$, $Q_3$, $Q_4$ and $Q_5$ output from the counter circuit 52 are introduced respectively; a sixth input terminal 57 into which a clock pulse CLK from the clock generating circuit 4 is given; first, second, third and fourth delayed flip-flops 42, 43, 44 and 45 which receive at the D-input terminals the counting outputs $Q_2$, $Q_3$, $Q_4$ and $Q_5$ from the second, third, fourth and fifth input terminals 62, 63, 64 and 65 and at the clock input terminals the clock pulse CLK from the sixth input terminal 57; a first AND gate 46 which is given the bit data $D_4$ from the fifth data input terminal 56 and count output $Q_1$ from the first input terminal 61; a second AND gate 47 which is given the bit data $D_3$ from the fourth data input terminal 55, counting output $Q_2$ from the second input terminal 62, and $\overline{Q}$ output of the first delayed flip-flop 42; a third AND gate 48 which is given the bit data $D_2$ from the third data input terminal 54, counting output $Q_3$ from the third input terminal 63, and $\overline{Q}$ output of the second delayed flip-flop 43; a fourth AND gate 49 which is given the bit data $D_1$ from the second data input terminal 53, counting output $Q_4$ from the fourth input terminal 64, and $\overline{Q}$ output of the third delayed flip-flop 44; a fifth AND gate 50 which is given the bit data $D_0$ from the first data input terminal 52, counting output $Q_5$ from the fifth input terminal 65, and $\overline{Q}$ output of the fourth delayed flip-flop 45; an OR gate 260 in which the outputs $A_1$, $A_2$, $A_3$, $A_4$ and $A_5$ of the first, second, third, fourth and fifth AND gates 46, 47, 48, 49 and 50 are introduced; and an output terminal 270 for applying an output $A_0$ of the OR gate 260 to the selectively composite circuit 7.

Figure 9:
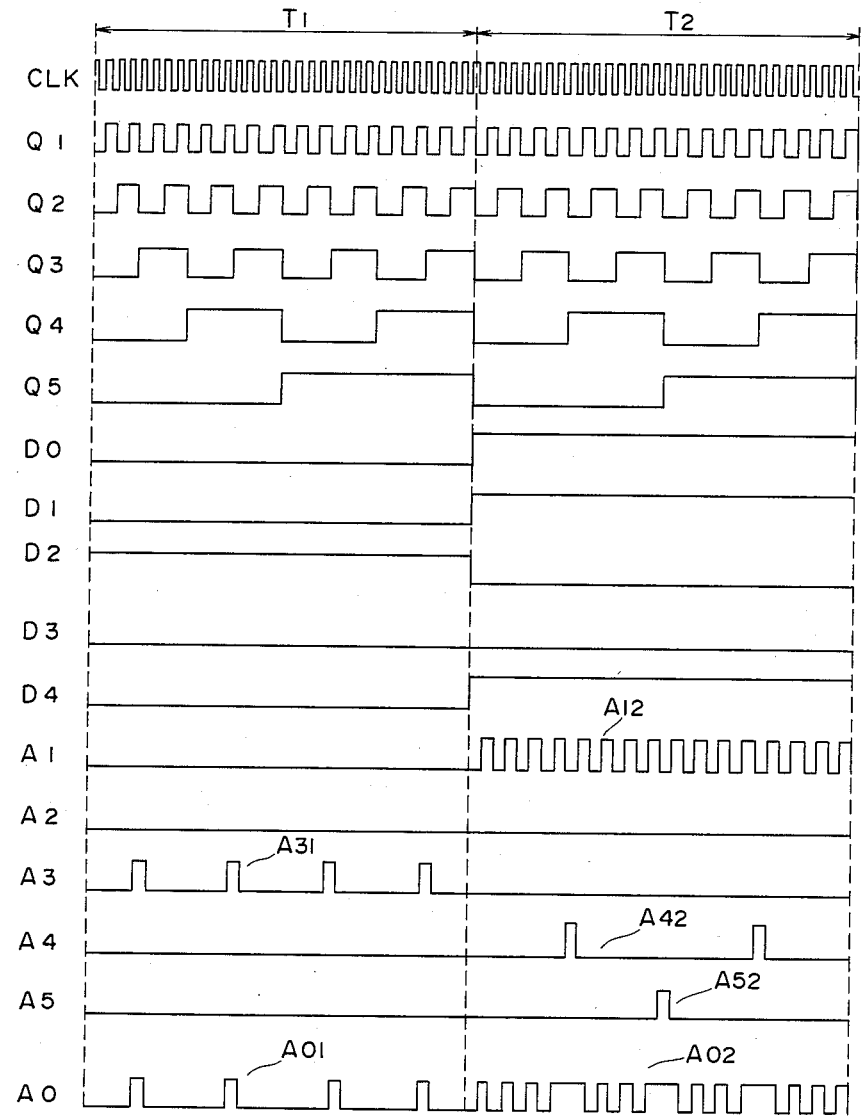
FIG. 9 is a time chart explanatory of operation of the circuit shown in FIG. 8.

Next, operation of the pulse formation circuit 60 will be explained in accordance with the time chart shown in FIG. 9. Now, we would assume that for first and second conversion periods $T_1$ and $T_2$, the data of the low order 4 bits of "0" ($a_0=0$, $a_1=0$, $a_2=0$ and $a_3=0$) and "15" ($a_0=1$, $a_1=1$, $a_2=1$ and $a_3=1$), in other words, the outputs from adder circuit 51 for the conversion period $T_1$ of "4" ($D_0=0$, $D_1=0$, $D_2=1$, $D_3=0$ and $D_4=0$) and in the period $T_2$ the output of "19" ($D_0=1$, $D_1=1$, $D_2=0$, $D_3=0$ and $D_4=1$), are introduced to the first, second, third, fourth and fifth data input terminals 52, 53, 54, 55 and 56 respectively.

Since the significant information (logical "1") is given only to the third input terminal 54 in the first conversion period $T_1$, the OR gate 260 outputs a signal $A_{01}$ (corresponding to "4" of digital data) identical with an output $A_{31}$ of the third AND gate 48. In the second conversion period $T_2$, since the significant information is given to the first, second and fifth data input terminals 52, 53 and 56, the AND gate outputs $A_{52}$, $A_{42}$ and $A_{12}$ appear at the fifth, fourth and first AND gates 50, 49 and 46 respectively. On the contrary, since no significant information "1" exist in the AND gates 47 and 48, a signal $A_{02}$ corresponding to the digital data "19" ($=15+4$) is output from the output terminal of the OR gate 260.

The D/A converter of the present invention is constructed as the above-mentioned can obtain from the first D/A converter circuit 360 voltages $V_1$ and $V_2$ corresponding to the input data $a_4$ to $a_{11}$ of 8 bits of the higher order. $V_1$ and $V_2$ have a potential difference of two times the minimum potential difference $e_M$, thereby being expressed in the following equations:

$$V_1 = (a_4 \cdot 2^0 + a_5 \cdot 2^1 + \ldots + a_{11} \cdot 2^7) \times (V_{ref} - V_E)/(2^8 + 2)$$

and $$V_2 = V_1 + 2 \times (V_{ref} - V_E)/(2^8 + 2)$$

Figure 10:
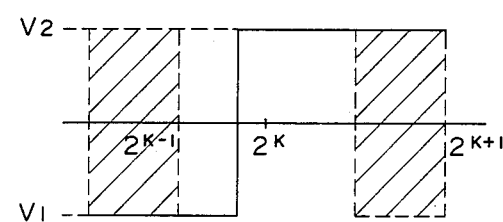
FIG. 10 is an illustration of operation of the same.

On the other hand, in the second D/A converter circuit 370, the data of the low order 4 bits is added with the data, a third bit from the lowest one being logical "1" and all other bits being logical "0" through the adder circuit 51, so that a signal corresponding to the data processed by addition is output from the pulse formation circuit 60, the output signal therefrom being introduced into the selectively composite circuit 7, from which the voltages $V_1$ and $V_2$ are alternately output. At this time, a mean level of $V_1$ and $V_2$ in a conversion period is not affected by the data, the third bit from the least significant one being logical "1" and all other bits being logical "0" (the hatched portions shown in FIG. 10 are to be offset) which is added by the adder circuit 51 as the counting number of the clock pulse is set as $2^5$, and corresponds to the data $a_0$ to $a_3$ of the 4 low order bits. Also, the output of the aforesaid selectively composite circuit 7 is given to the low-pass filter 8 and analog signals corresponding to the input data $a_0$ to $a_{11}$ are output.

Though the potential divider circuit which is constructed by using the $2^M + 2$ resistances selects two potentials with potential difference as large as two times the minimum potential difference in this embodiment, it is possible for the circuit to select two potentials with potential differences as large as three times or more the minimum potential difference by increasing the number of resistances, with whose effect being the same as the above.

The D/A converter so constructed as the abovementioned, regardless of the input data, inevitably selects once both the voltage $V_1$ and $V_2$ in a conversion period, whereby the signal of the harmonic spectrum larger in the high band and smaller in the low band is obtained as the output of the selectively composite circuit 7. Accordingly, the D/A converter is advantageous in that the band limitation by the low-pass filter 8 reduces the harmonic distortion.

In addition, the construction of the D/A converter shown in FIG. 8, which is the same as shown in FIG. 5, may be combined with the level shift circuits shown in FIGS. 6 and 7 so that the high order M bits of the data of N ($=M+K+J$) bits are given to the first D/A converter circuit 360, the middle order K bits of the same to the second D/A converter circuit 370, and the low order J bits to the third D/A converter circuit which comprises the level shift circuit.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within meets and bounds of the claims, or equivalents of such meets and bounds thereof are therefore intended to be embraced by the claims.

What is claimed is:

1. A digital/analog converter comprising:
   a data input unit for introducing digital data of K bits;
   first and second potential sources for individually outputting first and second potentials;
   a clock generating unit for generating clock pulses;
   a $2^K$ notation counter circuit having a K bit counting output for counting the clock pulses provided from said clock generating unit;

a pulse formation circuit jointly responsive to digital data from said data input unit and the counting output from said counter circuit for outputting a pulse signal varied in its pulse width and pulse cycle period corresponding to the contents of said digital data and representing the sum of the pulse widths for a period of $2^K$ clock pulses corresponding to the same, said pulse formation circuit being provided with K AND circuits each receiving as an input one of the bits of said data input unit and one of the bits of said counting output, said bits of said data input unit being applied to said AND circuits with a magnitude order of digits opposite to that of the counting output from said counter circuit;

a circuit for selecting either of said first or second potential corresponding to said pulse signal to compose a selected potential;

the counting output of said counter circuit, except for the lowermost bit, being also provided to delay flip-flops driven by the clock pulses and then being introduced together with the output of each of said flip-flops into each of said AND circuits.

2. A digital/analog converter characterized by being provided with a data input unit for introducing therein digital data of N(=M+K) bits, first and second potential sources provided with a decoder for decoding the high order M bits among digital data of N bits, a potential divider circuit for dividing the potential between the first reference potential and the second reference potential by $2^M$ resistances, and a circuit for selectively fetching from said potential divider circuit two potentials adjacent to each other corresponding to an output of said decoder, so that said two potentials adjacent to each other are output as first and second potentials, a clock generating unit for generating clock pulses, a $2^K$ notation counter circuit for counting the clock pulses given from said clock generating unit, a pulse formation circuit which is given the low order K bits among said digital data of N bits and the counting output from said counter circuit and which outputs a pulse signal being varied its pulse width and pulse cycle period corresponding to the contents of said low order K bits and being decided the sum of the pulse widths for a period of $2^K$ clock pulses corresponding to the same, and a circuit for selecting either of said first or second potential corresponding to said pulse signal and composing the selected potential.

3. A digital/analog converter as set forth in claim 2, wherein said pulse formation circuit is provided with AND circuits of K-number each having an input of two bits in combination of the magnitude order of digits of said digital data in the reverse order with the magnitude order of digits of the counting output from said counter circuit.

4. A digital/analog converter as set forth in claim 3, wherein the output of said counter circuit except for the lowermost digit in said counting output is also given to delayed flip-flops driven by the clock pulses of the objects for counting respectively and then is introduced together with the output of each of said flip-flops into each of said AND circuits.

5. A digital/analog converter characterized by being provided with a data input unit for introducing therein digital data of N(=M⇌K+J) bits, a first digital/analog converter circuit provided with a decoder for decoding the high order M bits among said digital data of N bits, a potential divider circuit for dividing the potential between the first reference potential and the second reference potential by $2^M$ resistance, and first and second potential sources which are provided with a circuit for selectively fetching two potentials adjacent to each other corresponding to a decoded output from said potential divider circuit and which output said two potentials adjacent to each other as the first and second potentials, a second digital/analog converter circuit provided with a clock generating unit for generating clock pulses, a $2^K$ notation counter circuit for counting the clock pulses given from said clock generating unit, a pulse formation circuit which is given the middle order K bits among said digital data of N bits and the counting output from said counter circuit and which outputs a pulse signal being varied its pulse width and pulse cycle period corresponding to the contents of said digital data of the middle order K bits and being decided the sum of the pulse widths for a period of $2^K$ clock pulses corresponding to the same, and a circuit for selecting either of said first or second potential corresponding to said pulse signal and composing the selected potential, and a third digital/analog converter circuit provided with first and second resistance networks being connected between said first reference potential source and one end of said potential divider circuit and between said second reference potential source and the other end of said potential divider circuit respectively, and a circuit for varying resistance values (the sum of said first and second resistance networks is always constant) of said resistance networks corresponding to the contents of the low order J bits among said digital data of N bits.

6. A digital/analog converter as set forth in claim 5, wherein said pulse formation circuit is provided with AND circuits of K-number each having an input of two bits in combination of the magnitude order of digits of said digital data in the reverse order with the magnitude order of digits of the counting output from said counter circuit.

7. A digital/analog converter as set forth in claim 6, wherein the output of said counter circuit except for the lowermost digit in said counting output is also given to delayed flip-flops driven by the clock pulses of the objects for counting respectively and then is introduced together with the output of each of said flip-flops into each of said AND circuits.

* * * * *